United States Patent [19]
Yamashita et al.

[11] Patent Number: 5,439,767
[45] Date of Patent: Aug. 8, 1995

[54] PHASE SHIFT MASK AND ITS INSPECTION METHOD

[75] Inventors: Hiroshi Yamashita; Tadao Yasuzato, both of Tokyo, Japan

[73] Assignee: NEC Corporation, Tokyo, Japan

[21] Appl. No.: 197,851

[22] Filed: Feb. 17, 1994

[30] Foreign Application Priority Data

Feb. 17, 1993 [JP] Japan .................................. 5-027060

[51] Int. Cl.⁶ .............................................. G03C 5/00
[52] U.S. Cl. ...................................... 430/30; 430/312; 430/313
[58] Field of Search ...................... 430/30, 5, 312, 313

[56] References Cited

U.S. PATENT DOCUMENTS 5,258,246  11/1993  Berger et al. ............................ 430/5
5,275,896  1/1994   Garofalo et al. ..................... 430/313

OTHER PUBLICATIONS

A. P. Gosh et al., "Direct Phase Measurements In Phase Shift Masks", SPIE, vol. 1673, Integrated Circuit Metrology, Inspection, and Process Control VI Aug. 1992, pp. 242–254.

Primary Examiner—S. Rosasco
Attorney, Agent, or Firm—Sughrue, Mion, Zinn, Macpeak & Seas

[57] ABSTRACT

A periodic line and space pattern made of chromium film is formed on a glass substrate, and a phase shifter is arranged on every other transparent portion of the line and space pattern. Using a stepper and the phase shift mask, photoresist film coated on a wafer is exposed several times to light of i-line by varying the focus, then developed. Next, the width Ws of the photoresist pattern formed by the exposure to the light through the phase shifter, and the width Wo of the photoresist pattern formed by the exposure to the light without passing through the phase shifter are measured. Based on the relation between Ws and Wo for defocusing, the transmittance error and the phase shift angle error of the phase shifter are obtained.

10 Claims, 4 Drawing Sheets

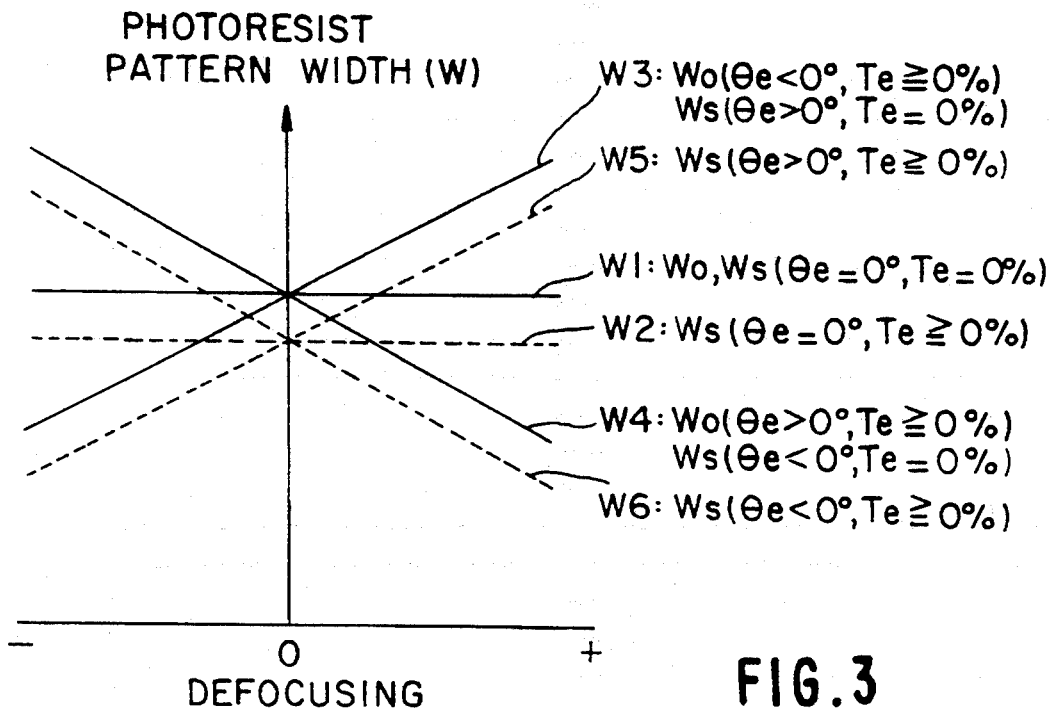
FIG.3
FIG.4
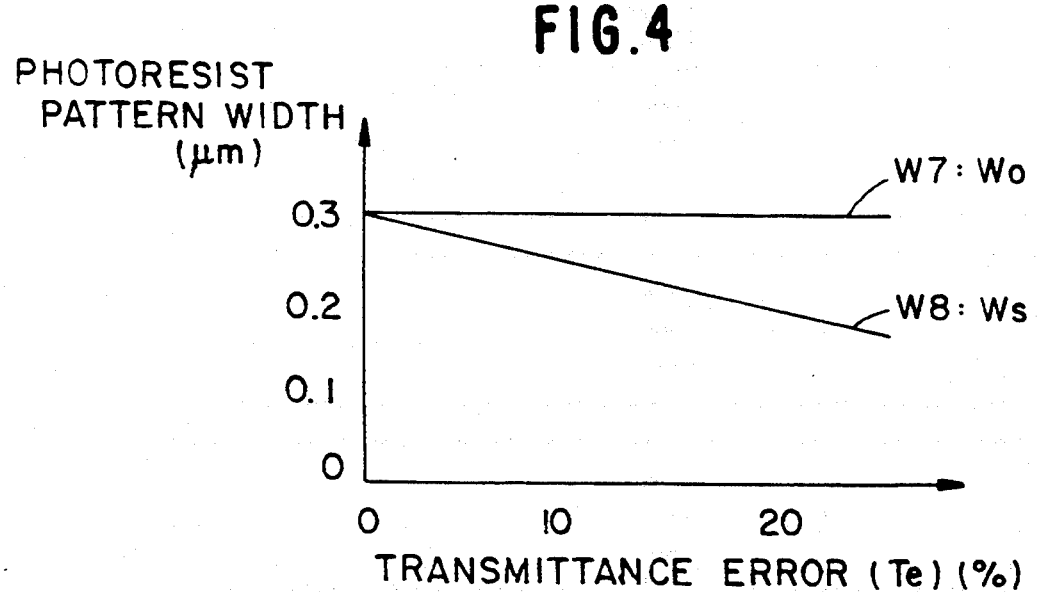

PHASE SHIFT MASK AND ITS INSPECTION METHOD

BACKGROUND OF THE INVENTION

1. Field of the Invention

The present invention relates to a phase shift mask to be used in a photolithogaraphy step of semiconductor fabrication and an inspection method thereof, and more particularly to an inspection method for measuring transmittance error and phase shift angle error of a phase shifter and a phase shift mask used therefor.

2. Description of the Related Art

Phase-shifting technology has been expected as one of useful method to enhance the performance of optical lithography. It is necessary to control with high precision transmittance and phase shift angle of the phase shifter to obtain good results. Heretofore, the measurement of transmittance error of a phase shifter of the mask has been measured by, for example, a self-spectrophotometer having light beam diameter of about 5 mm. The transmittance error is defined as the percentage of drop in the transmittance of the transparent portion where the phase shifter is placed when the transmittance of the transparent portion where the phase shifter is absent is taken as 100%. In addition, regarding the measurement of the phase shift angle of the phase shifter, there is proposed a method of mechanically measuring the film thickness of the phase shifter by, for example, a profilometer in which a needle is brought into contact with the phase shifter to trace the thickness, then calculating the phase shift angle, or a method which is disclosed in A. P. Ghosh and D. B. Dove, "Direct Phase Measurements in Phase Shift Masks", SPIE, Vol. 1673 (1992), pp. 242–249. The proposed phase shift angle measurement is shown in a sectional diagram in FIG. 1. Light beam emitted by a He-Ne laser 7 is split by a half mirror 8 into light beam B1 which is transmitted through a phase shifter 3 of a phase shift mask (consisting of a glass substrate 1, a chromium film 2 for forming a pattern, and a phase shifter 3) and light beam B2 which is transmitted through the adjacent portion where the phase shifter is absent. Then, light beams B1 and B2 are focused by a lens 9 on the surface of the phase shift mask. Finally, the two light beams B1 and B2 that are transmitted through the phase shift mask are combined again by a lens 9 and a half mirror 8, their interference intensity is determined by an optical interferometer 10, and the phase shift angle error is determined by calculating the phase difference from the value of the interference intensity. The phase shift angle error is defined as the deviation from the phase shift angle of 180° at which the maximum effect of the phase shift method can be obtained. In this case, the error is taken positive if the phase shift angle is greater than 180°, and it is taken negative if the phase shift angle is smaller than 180°.

In these conventional inspection methods of measuring the transmittance error of the phase shifter, when the transmittance error is measured using a self-spectrophotometer, the beam diameter is about 5 mm, so that there is required a pattern with greater than 5 mm in diameter for monitoring transmittance error of the phase shifter. When this requirement is applied to the phase shift mask which is to be mass produced, it is difficult to accommodate the pattern for measurement due to the problem of layout space.

Moreover, in the conventional inspection method of measuring the phase shift angle error of the phase shifter, when the phase shift angle error is measured using a profilometer, there is required a needle whose radius of curvature at the tip is a minimum of about 10 $\mu$m and a pattern with area greater than 100 $\mu$m square for measurement of the phase shift angle error of the phase shifter, considering the moving range of the needle centered around a step. In addition, in this case, the phase shift mask is damaged because the measurement is made by mechanically bringing the needle into contact with the phase shifter, which result in the deterioration in the yield of manufacture of the phase shift mask. For this reason, it was necessary to manufacture a dummy mask for monitoring for every regular phase shift mask.

Furthermore, when the phase shift angle error is measured using an optical interferometer, it is also necessary to arrange a broad pattern on the phase shift mask analogous to the case of using the self-spectrophotometer and the profilometer. In addition, in order to sufficiently enjoy the performance of the excellent resolution and the large focus depth of the phase shift mask, it is necessary to control with high precision the transmittance and the phase shift angle of the phase shifter.

BRIEF SUMMARY OF THE INVENTION

It is a major object of the present invention to resolve the above mentioned problems and to provide an inspection method for measuring the transmittance error and the phase shift angle error of a phase shifter on a phase shift mask and a phase shift mask used therefor.

The above object is achieved by providing a method comprising the steps of providing a periodic repetitious pattern on the phase shift mask and arranging the phase shifter on every other transparent portion of the periodic repetitious pattern, providing a substrate having a photoresist film formed thereon, exposing a first portion of the photoresist film to projected light of the periodic repetitious pattern in a first focusing condition, exposing a second portion of the photoresist film to projected light of the periodic repetitious pattern in a second focusing condition, and developing the photoresist film and measuring widths of the photoresist patterns in both the first portion and the second portion to obtain the transmittance error of the phase shifter and the phase shift angle error. The transmittance error and the phase shift angle error of the phase shifter are obtained based on the relation between a width of the photoresist pattern formed by the exposure to the light through the phase shifter and a width of the photoresist film formed by the exposure to the light without passing through the phase shifter for different focusing condition.

Another object of the present invention is achieved by providing a phase shift mask in which a periodic repetitious pattern is formed in a region which does not affect a semiconductor integrated circuit pattern on a glass substrate, and a phase shifter is arranged in every other transparent portion of the repetitious pattern.

BRIEF DESCRIPTION OF THE DRAWINGS

The above and further objects, features and advantages of the present invention will become more apparent from the following detailed description of the embodiments taken in conjunction with the accompanying drawings, wherein:

FIG. 3 is a graph illustrating the relation between phase shift angle error or transmittance error of the phase shifter and photoresist pattern width in the embodiment of the invention;

FIG. 4 is a graph illustrating the relation between transmittance error of the phase shifter and photoresist pattern width in the embodiment of the invention;

DETAILED DESCRIPTION OF THE PREFERRED EMBODIMENTS

Figure 1:
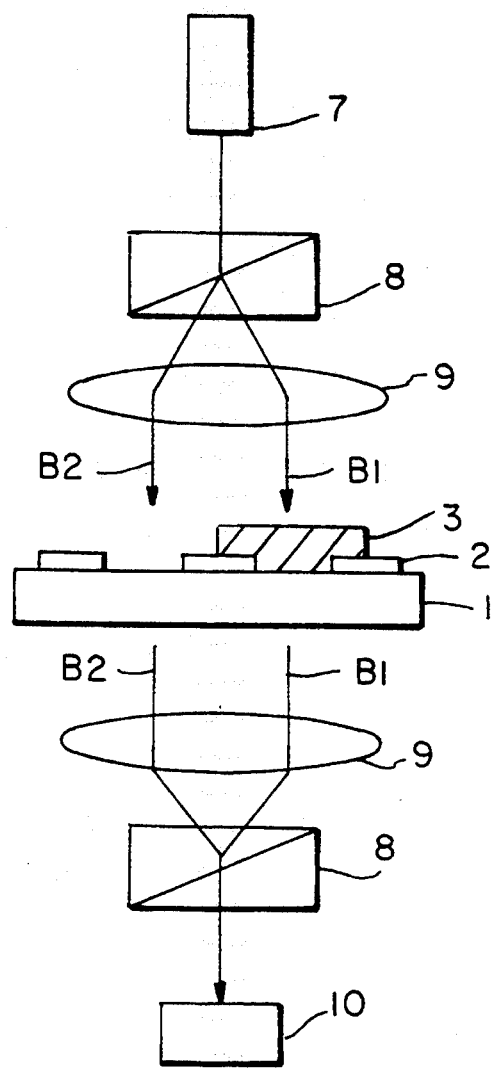
FIG. 1 is a sectional view illustrating the prior art method of phase shift error measurement.
Figure 2:
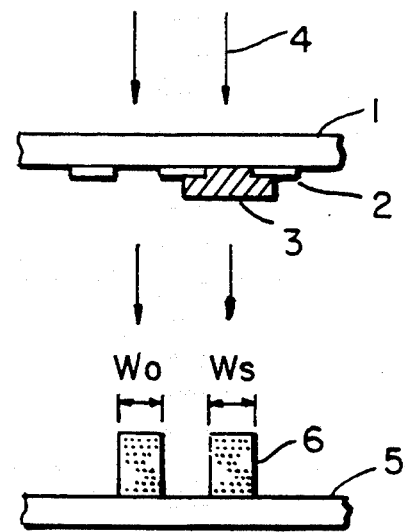
FIG. 2 is a sectional view illustrating an embodiment of the invention.
Figure 8A:
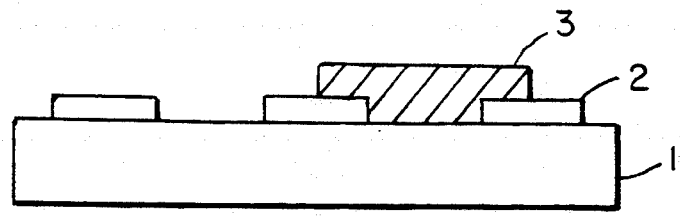
FIG. 8a is a sectional view illustrating a mask of top loaded shifter type.
Figure 8B:
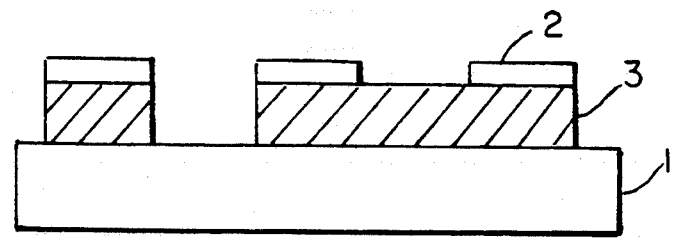
FIG. 8b is a sectional view illustrating a mask of bottom loaded shifter type.

Referring to the drawings, the present invention is described below. FIG. 2 is a sectional view illustrating an embodiment of the present invention. A periodic line and space pattern is formed on a glass substrate 1 using chromium film 2, and a phase shifter 3 is arranged in every other transparent portion of the line and space pattern. In this case, in order to minimize the influence of the proximity effect and carry out inspection with high accuracy, it is preferable that the line and space pattern has a minimum of 5 lines. The size of the line and space pattern has only about 2 $\mu$m on the mask. Accordingly, an area on the mask of about 19 $\mu$m square at the most is sufficient for the structure of the present invention. In the present invention the line and space on the wafer is chosen to be about 0.3 $\mu$m in width. In this embodiment of the invention, the line and space pattern is formed in scribe line areas of the semiconductor chip so as not to affect the performance of the semiconductor chip. Although a mask of top loaded shifter type, as shown in FIG. 8a, is employed in this embodiment, similar effect can also be obtained by using a mask of bottom loaded shifter type as shown in FIG. 8b. Using a stepper (NA=0.45) and the phase shift mask, a photoresist film 6 coated on a wafer 5 is exposed several times to light of i-line 4 to be reduced to 1/5 in size by stepping and by varying focus condition, then developed. In this embodiment of the invention, i-line is used as the exposure light source. Next, the width Ws of the photoresist pattern on the wafer 5 formed by the exposure with a phase shifter 3, and the width Wo of the photoresist pattern formed by the exposure without the phase shifter are measured by scanning electron microscope (SEM). An inspection with high precision can be carried out if the length measurement is made by employing the pattern at the central part of the line and space pattern that has less influence of the proximity effect.

In this case, the relation between the photoresist pattern width and the defocusing is generally given as shown by the graph in FIG. 3. This relation is described in more detail in the following by referring to graphs in FIGS. 4 to 7. In FIG. 4 is shown a relation between the transmittance error (Te) of the phase shifter and the photoresist pattern width at the time of just focusing on the photoresist film. The photoresist pattern width Ws has the same value as for Wo when the transmittance error is zero as shown in W8, but it decreases with the increase in the transmittance error (Te=100−T), namely, the decrease in the transmittance (T). In the figure, W7 shows the change of Wo. Noticing that the photoresist pattern width changes with the transmittance error, it is possible to determine the transmittance error of the phase shifter from the variation in the photoresist pattern width.

Figure 5:
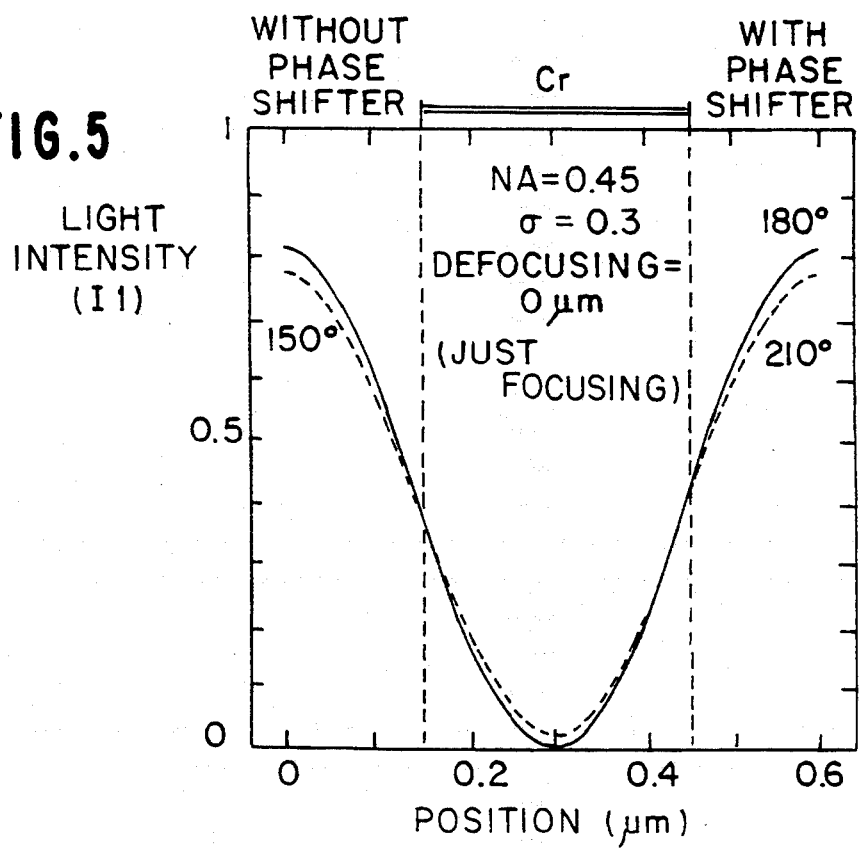
FIG. 5 is a graph illustrating light intensity distribution in the case of just focusing in the embodiment of the invention.
Figure 6:
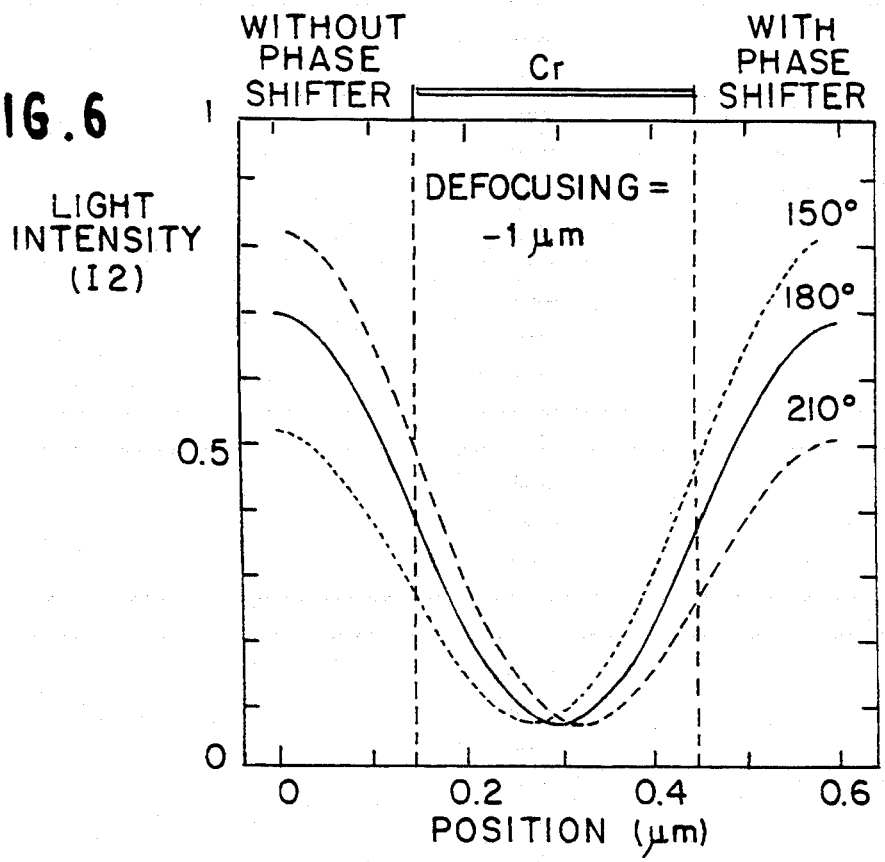
FIG. 6 is a graph illustrating light intensity distribution in the case of defocusing of $-1$ $\mu$m in the embodiment of the invention.
Figure 7:
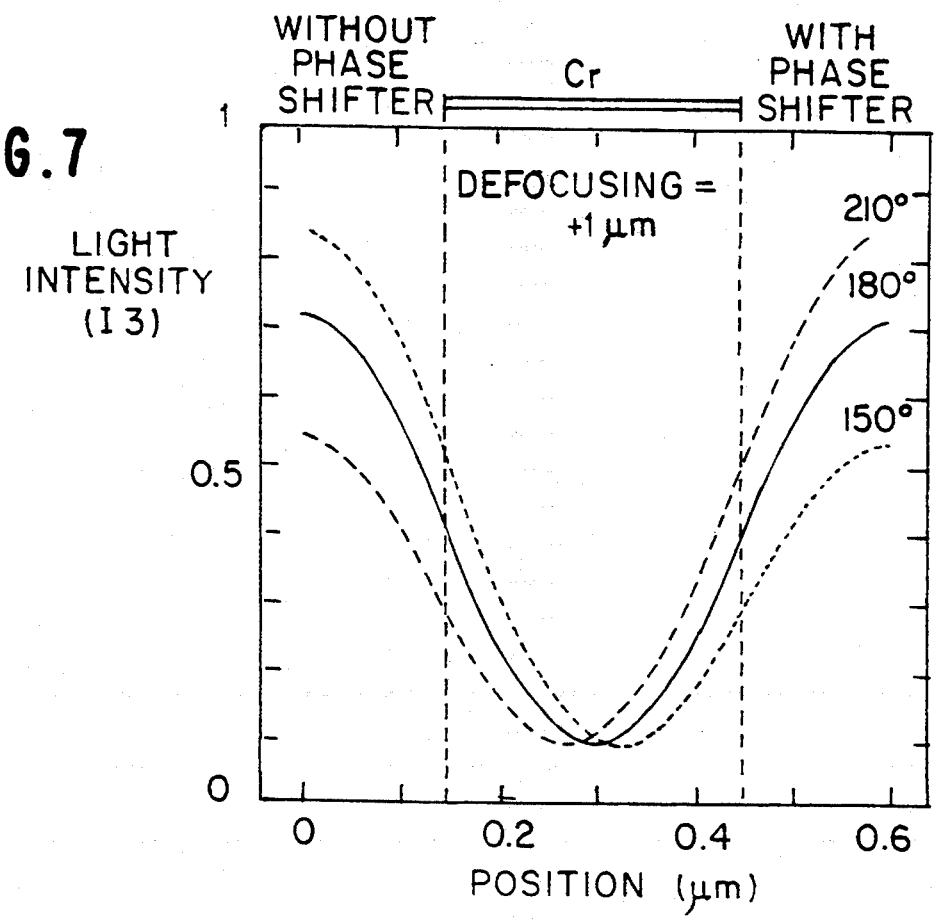
FIG. 7 is a graph illustrating light intensity distribution in the case of defocusing of $+1$ $\mu$m in the embodiment of the invention.

Next, the relation between the phase shift angle error of the phase shifter and the light intensity is shown in FIGS. 5 to 7 for various values of focusing. In each figure, the central part corresponds to the part shielded by chromium film, the part on the right side is the part where the phase shifter is placed, and the part on the left side is the part where the phase shifter is not placed. FIG. 5 shows the case of just focusing, FIG. 6 the case of defocusing of $-1$ $\mu$m, and FIG. 7 the case of defocusing of $+1$ $\mu$m.

When the phase shift angle error is zero, namely, when the phase shift angle is 180°, as shown in FIG. 5, the light intensity I1 for just focusing is laterally symmetric for the right part where the phase shifter is placed and for the left part where the phase shifter is absent regardless of the focus change, and eventually the photoresist pattern widths Ws and Wo become equal as shown in FIG. 3. However, when the phase shift angle error is positive, for example, when the phase shift angle is 210°, the light intensity I2 is shifted from the laterally symmetric situation for the just focusing in FIG. 5, and for defocusing of $-1$ $\mu$m, as shown in FIG. 6, the light intensity for the right part where the phase shifter is placed is decreased while the light intensity for the left side where the phase shifter is absent is increased. Because of this, the photoresist pattern width for negative focusing behaves such that Ws is decreased whereas Wo is increased as shown in FIG. 3. On the other hand, for defocusing of $+1$ $\mu$m, the behavior is the opposite to that in FIG. 6, as shown in FIG. 7, and for positive defocusing, Ws is increased and Wo is decreased.

Moreover, when the phase shift angle error is negative, for example, when the phase shift angle is 150°, the light intensity I3 behaves opposite to that for the case of positive phase shift error as shown in FIGS. 6 and 7. In short, by an explanation similar to the above, the photoresist pattern width, for positive defocusing, Ws is decreased and Wo is increased as shown in FIG. 3. In contrast, for negative defocusing, Ws is increased and Wo is decreased. As in the above, when the phase shift angle deviates from 180°, the photoresist pattern width changes symmetrically with respect to the defocusing, and the phase shift angle becomes determinable from the variation (slope) of the curve for the photoresist pattern width.

Based on the new findings in the above, as shown in FIG. 3, the relations between the transmittance error (Te) or the phase shift angle error ($\theta$e), and the photoresist pattern width (Ws or Wo) are obtained. In what follows these relations will be summarized.

When the transmittance error and the phase shift angle error of the phase shifter are zero (Te=0% and $\theta$e=0°), the photoresist pattern widths Ws and Wo are in the situation as shown in W1, being constant with respect to the defocusing.

When the transmittance error of the phase shifter is equal to or greater than zero and the phase shift angle error is equal to zero ($Te \geq 0\%$ and $\theta e = 0°$), the photoresist pattern width Wo remains as in W1, but Ws decreased as in W2 compared with W1 owing to drop of the transmittance due to the phase shifter. The relation between the decrease in this case and the transmittance error becomes as shown in FIG. 4.

When the transmittance error of the phase shifter is zero and the phase shift angle error is positive, namely, when the phase shift angle is greater than 180° ($Te = 0\%$ and $\theta e > 0°$), the photoresist pattern width Ws increases with the increase in the defocusing as W3, but the photoresist pattern width Wo decreases with the increase in the defocusing as in W4 opposite to the behavior of Ws.

When the transmittance error of the phase shifter is zero and the phase shift angle error is negative, namely, when the phase shift angle is smaller than 180° ($Te = 0\%$ and $\theta e < 0°$), the photoresist pattern width Ws decreases with the increase in the defocusing as in W4 and the photoresist pattern width Wo increases with the increase in the defocusing as in W3, opposite to the above mentioned tendency.

When the transmittance error of the phase shifter is equal to or greater than zero and the phase shift angle error is positive ($Te \geq 0\%$ and $\theta e > 0°$), the photoresist pattern width Wo remains the same as in W4, but the photoresist pattern width Ws changes as in W5.

When the transmittance error of the phase shifter is equal to or greater than zero and the phase shift angle error is negative ($Te \geq 0\%$ and $\theta e < 0°$), the photoresist pattern width Wo behaves like in W3, but the photoresist pattern width Ws changes as in W6.

In other words, when the transmittance error and the phase shift angle error are zero, the photoresist pattern widths Ws and Wo are nearly constant regardless of the change in the defocusing. When there exists only a phase shift angle error, that is, when the phase shift angle deviates from 180°, the photoresist pattern widths Ws and Wo increase or decrease corresponding to the change in the defocusing. When there exists only a transmittance error, the behavior of the photoresist pattern width Wo is the same as in the case of the zero transmittance error, but the photoresist pattern width Ws decreases compared with the photoresist pattern width Wo due to the drop in the transmittance. Further, when there exist both the transmittance error and phase shift angle error, the photoresist pattern widths Ws and Wo show the behavior which is the superposition of the two behaviors in the above.

Since these relations in the above vary in detail depending upon the aligner, the dimensions of the photoresist pattern and the line and space pattern, or the like, it is necessary to prepare in advance calibration curves in order to carry out exact measurements. In the above, the case of using a negative type photoresist is described, but similar result can be obtained when a positive type photoresist is used by measuring the space width of the photoresist pattern.

As described in the above, this invention enables the measurement of the transmittance error and the phase shift angle error by the use of a pattern having an area of 19 $\mu$m square at the most with structure in which a periodic line and space pattern is provided on a glass substrate, and a phase shifter is arranged in every other transparent portion.

Since the transmittance error and the phase shift angle error of the phase shifter can be measured in non-contact manner without giving damage to the mask by measuring the width of the photoresist pattern transferred using the phase shift mask of the above structure, the dummy mask for film thickness monitoring is no longer needed, reducing the number of masks to one half, which shows the effect of improving the yield of mask manufacture to 50 to 100%.

In addition, this invention has an effect of producing high precision of $\pm 1\%$ can be obtained from the SEM measurement data in the measurement of the phase shift angle error. In the measurement of the transmittance error, a precision of $\pm 5\%$ can be obtained from the measurement data. Thus, this invention has an effect of producing a measurement with accuracy comparable to that obtained by the conventional self-spectrophotometer by means of a simple measurement method.

The invention has thus been shown and described with reference to the specific embodiments. However, it should be noted that the present invention is in no way limited to the details of the embodiments but changes and modifications may be made within the scope of the invention as defined by the appended claims.

What is claimed is:

1. A method of inspecting a transmittance error of a phase shifter on a phase shift mask, comprising the steps of:

providing a periodic repetitious pattern on the phase shift mask and arranging the phase shifter on every other transparent portion of the periodic repetitious pattern;

providing a substrate having a photoresist film formed thereon;

exposing a first portion of the photoresist film to projected light of the periodic repetitious pattern in a second focusing condition, one of the first and second focusing condition is a defaces condition;

developing the photoresist film to obtain a first width of a photoresist pattern formed by the exposure with the transparent portion and a second width of a photoresist pattern formed by the exposure with the phase shifter in both of said first portion and said second portion; and determining existence of the transmittance error by finding a condition that the second width is smaller than the first width.

2. A method of inspecting a phase shift angle error of a phase shifter on a phase shift mask, comprising the steps of:

providing a periodic repetitious pattern on the phase shift mask and arranging the phase shifter on every other transparent portion of the periodic repetitious pattern;

providing a substrate having a photoresist film formed thereon;

exposing a first portion of the photoresist film to projected light of the periodic repetitious pattern in a first focusing condition;

exposing a second portion of the photoresist film to projected light of the periodic repetitious pattern in a second focusing condition, one of the first and second focusing condition is a defaces condition;

developing the photoresist film to obtain a first width of a photoresist pattern formed by the exposure with the transparent portion and a second width of a photoresist pattern formed by the exposure with the phase shifter in both of said first portion and said second portion; and determining existence of the phase shift angle error by finding a condition that either the first width or the second width increases or decreases corresponding to change in the defaces condition.

3. An inspecting method of a phase shift mask comprising steps of:

providing a periodic line and space pattern made of opaque film formed on a transparent substrate;

forming a phase shifter on every other transparent portion of said line and space pattern to provide a phase shift mask;

exposing a photoresist film coated on a wafer to light passing through said phase shift mask at least two times by varying focus condition at different areas, one of said varying focus condition is a defaces condition;

developing said photoresist film to obtain a first width of a photoresist pattern formed by exposure to said light through said phase shifter and a second width of a photoresist pattern formed by exposure to said light without passing through said phase shifter; and measuring said first and second widths of the photoresist pattern to find a size relationship between them to determined existence of a transmittance error and a phase shift angle error based on a predetermined relation thereof.

4. An inspecting method of a phase shift mask according to claim 3, wherein said wafer is a semiconductor chip wafer and said first and second width of a photoresist pattern are formed on areas corresponding to scribe line areas of said semiconductor chip wafer.

5. An inspecting method of a phase shift mask according to claim 3, wherein measurement of said first and second width of said photoresist pattern is made by employing a pattern at a central part of said periodic line and space pattern.

6. An inspecting method of a phase shift mask according to claim 3, wherein measurement of said first and second width of said photoresist pattern is made by employing a scanning electron microscope.

7. An inspecting method of a phase shift mask according to claim 3, wherein said light is a light of i-line.

8. An inspecting method of a phase shift mask comprising steps of:

exposing a photoresist film by using a phase shift mask having a transparent portion and a phase shifter portion in a first focus condition at a first region;

exposing the photoresist film by using said phase shift mask in a second focus condition at a second region, one of said first and second focus condition is defaces condition;

developing the photoresist film to obtain a first photoresist pattern and a second photoresist pattern, said first photoresist pattern having first and second photoresist widths formed by the exposure with the transparent portion and the shifter portion, respectively, in the first focus condition, said second photoresist pattern having third and fourth photoresist widths formed by the exposure with the transparent portion and the shifter portion, respectively, in the second focus condition; and measuring said first, second, third and fourth photoresist widths to find a size relationship among them to determine existence of a transmittance error and a phase shift angle error.

9. An inspecting method of a phase shift mask according to claim 8, wherein said existence of a transmittance error is determined by finding a condition that either one of said second and third photoresist widths is smaller than said first and third photoresist widths.

10. An inspecting method of a phase shift mask according to claim 8, wherein said existence of a phase shift angle error is determined by finding either a condition that said first width is different from said third width or a condition that said second width is different from said fourth width.

* * * * *